United States Patent
Müller

(10) Patent No.: US 7,570,147 B2
(45) Date of Patent: Aug. 4, 2009

(54) FUSE COMPONENT COMPRISING AN OPTICAL INDICATOR

(75) Inventor: Rüdiger Müller, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 173 days.

(21) Appl. No.: 10/488,378

(22) PCT Filed: Aug. 7, 2002

(86) PCT No.: PCT/DE02/02907

§ 371 (c)(1),
(2), (4) Date: Aug. 23, 2004

(87) PCT Pub. No.: WO03/028060

PCT Pub. Date: Apr. 3, 2003

(65) Prior Publication Data

US 2004/0257191 A1    Dec. 23, 2004

(30) Foreign Application Priority Data

Aug. 31, 2001    (DE) ................... 101 42 654

(51) Int. Cl.
*H01H 85/30* (2006.01)
*H01H 85/32* (2006.01)
(52) U.S. Cl. ................... 337/206; 337/241; 337/242
(58) Field of Classification Search ................ 337/241, 337/242, 245, 265–267, 206, 79, 332, 376, 337/159; 439/490, 491; 361/835; 81/3.8; 116/202
See application file for complete search history.

(56) References Cited

U.S. PATENT DOCUMENTS

| 4,281,322 | A | * | 7/1981 | Nasu et al. ................. 340/638 |
| 4,350,407 | A | | 9/1982 | Tong |
| 4,499,447 | A | * | 2/1985 | Greenberg ................. 337/266 |
| 4,511,875 | A | | 4/1985 | Arikawa |
| 4,673,928 | A | * | 6/1987 | Guim ........................ 340/638 |
| 4,695,815 | A | | 9/1987 | Hwang |
| 4,712,081 | A | * | 12/1987 | Bosley ...................... 337/266 |
| 5,111,177 | A | * | 5/1992 | Krueger et al. ............. 337/243 |
| 5,150,016 | A | | 9/1992 | Sawase et al. |

(Continued)

FOREIGN PATENT DOCUMENTS

DE    42 42 842    11/1999

(Continued)

OTHER PUBLICATIONS

Translation of Japanese Office Action issued in the corresponding Japanese Patent application No. 2003-531494.

(Continued)

*Primary Examiner*—Anatoly Vortman
(74) *Attorney, Agent, or Firm*—Cohen Pontani Lieberman & Pavane LLP

(57) ABSTRACT

A fuse component with an optical indicator, which has a first terminal (2) and a second terminal (3) and also a fusible link (4), which connects the terminals (2) and (3) in an electrically conducting manner. Connected in parallel with the fusible link (4) is at least one LED (8), which indicates the failure of the fuse if the fusible link (4) is interrupted. Preferably two LEDs are connected in antiparallel with the fusible link.

17 Claims, 2 Drawing Sheets

U.S. PATENT DOCUMENTS

Figure 1:
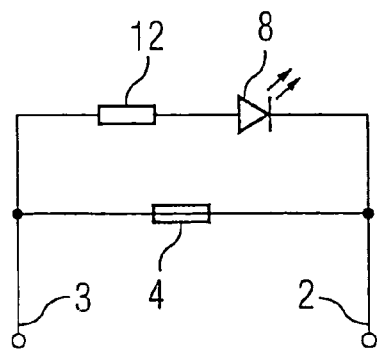

| | | | |
|---|---|---|---|
| 5,298,768 A | | 3/1994 | Okazaki et al. |
| 5,598,138 A | * | 1/1997 | Jaronczyk, Jr. ............... 337/265 |
| 5,701,118 A | * | 12/1997 | Hull et al. .................... 340/638 |
| 5,883,562 A | * | 3/1999 | Matsuoka et al. ............ 337/273 |
| 5,973,418 A | * | 10/1999 | Ciesielka et al. ............. 307/130 |
| 6,093,940 A | * | 7/2000 | Ishinaga et al. ................ 257/99 |
| 6,144,284 A | * | 11/2000 | Santa Cruz et al. .......... 337/242 |
| 6,448,897 B1 | * | 9/2002 | Ku .............................. 340/638 |
| 6,538,306 B1 | * | 3/2003 | Inada et al. ................... 257/666 |
| 6,577,222 B1 | * | 6/2003 | Krueger et al. ............... 337/246 |
| 6,583,444 B2 | * | 6/2003 | Fjelstad ........................ 257/82 |
| 6,806,583 B2 | * | 10/2004 | Koay et al. ................... 257/787 |
| 6,836,206 B2 | * | 12/2004 | Lee .............................. 337/243 |
| 6,888,168 B2 | * | 5/2005 | Fjelstad ........................ 257/81 |
| 6,949,771 B2 | * | 9/2005 | Yoganandan et al. .......... 257/99 |

FOREIGN PATENT DOCUMENTS

| | | |
|---|---|---|
| EP | 0 911 853 | 4/1999 |
| EP | 1 003 194 | 5/2000 |
| JP | 63-52671 | 10/1989 |
| JP | 4-132275 | 5/1992 |
| JP | 5-500434 | 5/1992 |
| JP | 5-31086 | 4/1993 |
| WO | WO 91/05359 | 4/1991 |

OTHER PUBLICATIONS

English translation of Office Action dated Jun. 20, 2008 issued in corresponding application No. 2003-531494.

* cited by examiner though they have not been fitted for some time, even if not
FUSE COMPONENT COMPRISING AN OPTICAL INDICATOR

RELATED APPLICATIONS

This is a U.S. national stage of application No. PCT/DE02/02907, filed on Aug. 07, 2002.

This patent application claims the priority of German patent Application No. 101 42 654.2, the disclosure content of which is hereby incorporated by reference.

FIELD OF THE INVENTION

The invention relates to an electrical fuse component with an optical indicator.

The invention relates to an electrical fuse component with an optical indicator according to the precharacterizing clause of patent claim 1.

BACKGROUND OF THE INVENTION

Fuse components of this type generally have a fusible link, which is dimensioned such that, if a maximum current is exceeded, the fusible link melts through and the current flow is consequently interrupted. The fusible link is usually fitted in a housing, so that a defect of the fusible link can often only be identified poorly from the outside. Moreover, identifying such a defect is usually made more difficult by the small dimensions of the fusible link.

U.S. Pat. No. 4,695,815 discloses an automobile fuse with an optical indicator. Here, a bulb is connected in parallel with the fusible link. If the fusible link is interrupted, the bulb lights up and in this way indicates the defect of the fuse. Also shown is an automobile fuse in which the bulb is arranged in a housing recess.

In the case of this arrangement, the bulb is freely accessible from the outside, so that there is the risk of damage being caused by external action. Additional protection by means of an enclosure, for example an encapsulating composition, requires additional effort, since it must be ensured that the encapsulating composition is thermally and mechanically adapted to the glass envelope of the bulb. Furthermore, there must be adequate adhesion between the glass envelope and the encapsulating composition and the ingress of moisture into the fuse must be prevented.

Moreover, bulbs are comparatively sensitive components, so that after they have been fitted for some time, even if not illuminated, there is the risk of a bulb defect, for example loss of the vacuum in the glass envelope or breakage of the filament. Such a defect, albeit rare, of the failure indicator of such a fuse must be especially avoided, since the user relies on the optical failure indicator, and therefore a burnt fuse with a defective failure indicator can only be found with great difficulty.

SUMMARY OF THE INVENTION

It is an object of the present invention is to provide a fuse component with an optical indicator which has great reliability.

It is also an object of the invention to provide a fuse component with an optical indicator which can be produced at low-cost and in a technically simple manner.

This and other objects are attained in accordance with one aspect of the invention directed to a fuse component having a first and a second terminal that are connected to each other in an electrically conducting manner by means of a fusible link.

As the optical indicator, the fuse component includes at least one LED (light-emitting diode), which is connected on the cathode side to the first terminal and on the anode side to the second terminal. An LED is to be understood as meaning both a corresponding optoelectronic component, which may in particular have a housing or a mounting body, and preferably an LED semiconductor chip. The LED is preferably connected in series with a current-limiting resistor.

An LED has a very long service life and also has great fail safety. Even great fluctuations of the ambient temperature can be tolerated. Finally, fuses with LEDs can be produced at very low cost, which is explained in more detail below.

In the case of an advantageous development of the invention, two LEDs are respectively connected in parallel with the fusible link, with the forward directions of the LEDs being opposed to each other. This has the advantage that failure of the fuse is indicated independently of the polarity of the fuse, since in any event one of the two LEDs is polarized in the forward direction. On account of the symmetrical connection of the LEDs, the fuse component can be used like a conventional fuse, without having to consider polarity.

The contacts and the fusible link are preferably arranged on a leadframe or formed as parts of a leadframe. The LED is attached on the leadframe in a way known per se. Technologies for producing leadframes and for mounting LEDs on them are known and established. A fuse component according to the invention can consequently be produced at low cost by using existing production installations.

It is particularly preferred for the leadframe to have the basic form of a yoke, the yoke arms forming the terminals of the fuse component. The fusible link may be formed as part of the yoke bar or parallel to the yoke bar. Depending on the embodiment, for this purpose the yoke bar is interrupted or reduced in cross section to the required dimensions of the fusible link. In the case of a preferred embodiment, the yoke-like shaping corresponds substantially to the basic form of a conventional automobile fuse, so that the invention is compatible with these fuses.

In the case of an advantageous refinement of the invention, the leadframe has at least one chip connecting pad and at least one wire connecting pad, the LED being mounted in the form of an LED chip on the chip connecting pad and connected in an electrically conducting manner to the wire connecting pad by means of a wire bridge. The chip connecting pad and the wire connecting pad are in this case arranged on the leadframe in such a way that the LED is connected in parallel with the fusible link.

Leadframes are usually used for contacting and as a support for LED chips. This leadframe advantageously forms the fusible link at the same time, so that in the case of the invention only a small number of individual components are required. The current-limiting resistor may be formed on the wire connecting pad in a way known per se in the form of a thick-film resistor.

The fuse component including the LED is preferably surrounded at least partly by an enclosure, preferably a molding composition. In this case it is expedient that the enclosure is permeable to the light generated by the LED. Molding compositions suitable for the enclosure of LED chips are known and optimized to a high degree, so that enclosure of the fuse component does not involve any particular technical effort. Reaction resins, such as for example epoxy, acrylic or silicone resins or mixtures of these, are suitable in particular as the molding composition. Such an enclosure produces a compact fuse component that is well protected from harmful effects.

It is preferred for side faces of the enclosure to be roughened or structured, in order to increase the coupling-out of light. This further improves the visibility of the optical indicator in the event of a defect. Roughening may take place mechanically, for example by sand blasting, or chemically, for example by etching.

The color of the light emitted by the LED may serve furthermore for identifying the type of fuse, in particular the maximum current. Consequently, in the event of failure of the fuse component, it is advantageously evident immediately which replacement is required.

Figure 2:
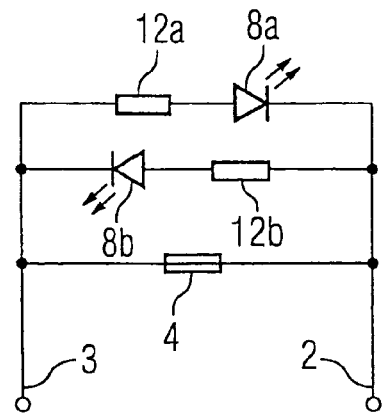
Figure 3:
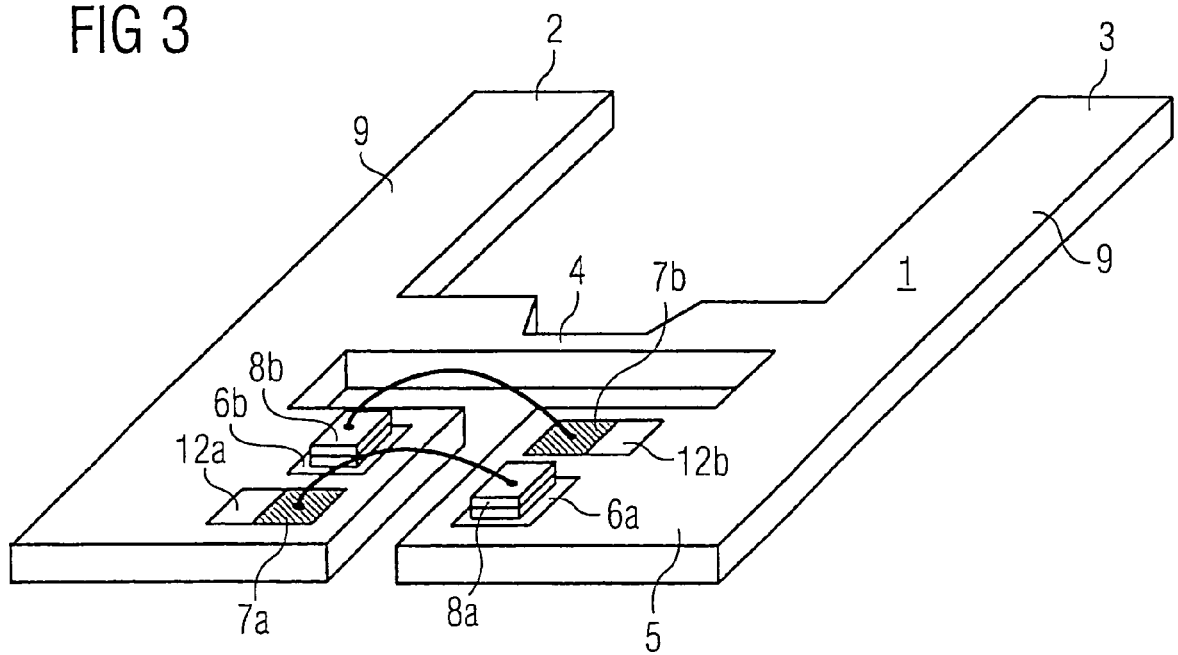
Figure 4:
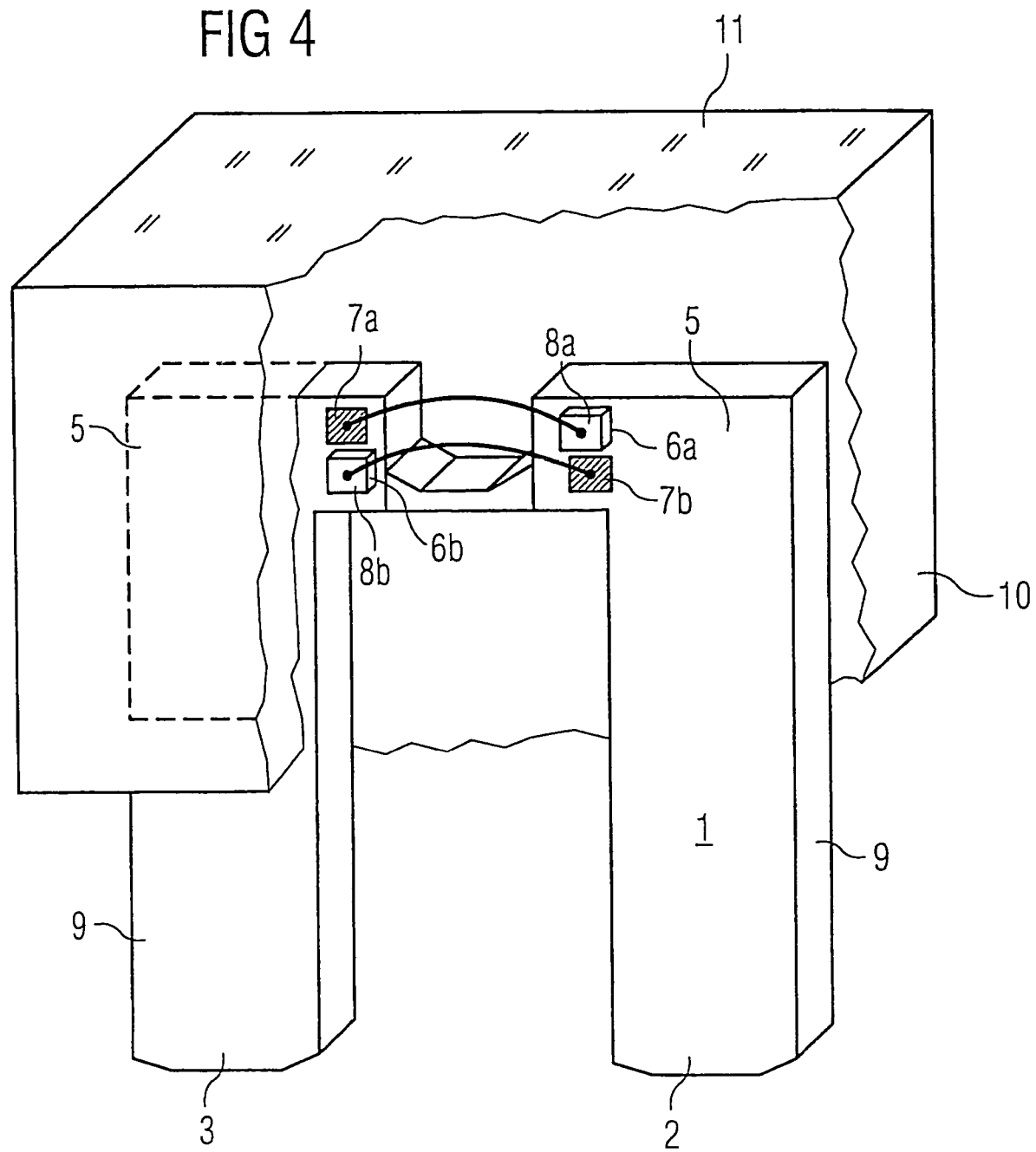

Further features, advantages and expedient aspects of the invention are explained on the basis of four exemplary embodiments in conjunction with FIGS. 1 to 4, in which:

FIG. 1 shows a circuit diagram of a first exemplary embodiment of a fuse component according to the invention, FIG. 2 shows a circuit diagram of a second exemplary embodiment of a fuse component according to the invention, FIG. 3 shows a schematic perspective view of a third exemplary embodiment of a fuse component according to the invention and FIG. 4 shows a schematic perspective view of a fourth exemplary embodiment of a fuse component according to the invention.

DETAILED DESCRIPTION OF THE DRAWINGS

Elements which are the same or act in the same way are provided with the same designations in the Figures.

Shown in FIG. 1 is the circuit diagram of a fuse component according to the invention. The circuit has a first terminal 2 and a second terminal 3, which are connected to each other in an electrically conducting manner by means of a fusible link 4. Connected in parallel with this fusible link 4 is a series connection comprising an LED 8 and a current-limiting resistor 12.

As long as the fusible link 4 is intact, the LED 8 is short-circuited by the fusible link 4 and the LED 8 does not light up. After the fusible link 4 has been interrupted, at least a part of the operating voltage is applied between the terminals 2 and 3. If in this case the terminal 3 is at a higher potential than the terminal 2, a current flows through the LED 8 and the LED 8 lights up. This indicates that the fusible link 4 is interrupted.

The current-limiting resistor 12 is in this case dimensioned such that, even when the full operating voltage is applied, for example 12 V in the case of an automobile fuse, between the terminals 2 and 3, the current flowing remains limited to the nominal current of the LED 8. This nominal current generally lies between 1 mA and 20 mA; the current-limiting resistor 12 for a 12 V automobile fuse correspondingly lies between 12 kΩ and 600 kΩ.

Shown in FIG. 2 is the circuit diagram of a further exemplary embodiment of the invention. As a difference from the previous circuit, here two series connections each with an LED 8a, 8b and a current-limiting resistor 12a, 12b are connected in parallel with the fusible link 4, the forward directions of the LEDs 8a, 8b being opposed to each other. Consequently, the circuit is independent of the polarity of the voltage present between the terminals 2 and 3 with regard to the optical indicator. Like conventional fuses, the circuit element formed in this way has no polarization, so that inadvertent fitting with the wrong polarity is advantageously ruled out.

The exemplary embodiment of the invention represented in FIG. 3 has a yoke-shaped leadframe 1, the yoke arms 9 forming the terminals 2 and 3 of the fuse component. The terminals 2 and 3 are connected in an electrically conducting manner by means of a fusible link 4 formed separately from the yoke bar 5. The material of the leadframe and the thickness and width of the fusible link 4 are chosen appropriately for the maximum current intended, in such a way that the fusible link 4 melts through as soon as it is flowed through by a greater current than the maximum current intended.

The yoke bar 5 is centrally interrupted by a slit formation, so that no current can flow between the terminals 2 and 3 via the bar 5 itself. Respectively arranged on the leadframe, on either side of the interruption, is a chip connecting pad 6a, 6b and a wire connecting pad 7a, 7b, the wire connecting pads 7a, 7b being formed as thick-film resistors 12a, 12b for current limitation. Respectively attached on the chip connecting pad 6a, 6b is an LED chip 8a, 8b. The LED chip 8a, 8b may for example be adhesively bonded on by means of a conductive adhesive or soldered on. Formed on the upper side of the LED chips 8a, 8b is a contact metallization, onto which a wire connection is soldered. The wire connection respectively establishes the contact with the wire connecting pad 7a, 7b arranged on the opposite side of the interruption.

Represented in FIG. 4 is a further exemplary embodiment of a fuse component according to the invention. The fuse component in turn includes a yoke-shaped leadframe 1, the yoke arms 9 forming the terminals 2 and 3. As a difference from the previous exemplary embodiment, the fusible link 4 is formed centrally as part of the yoke bar 5. Respectively arranged on either side of the fusible link 4 is a chip connecting pad 6a, 6b with an LED chip 8a, 8b attached on it and also a wire connecting pad 7a, 7b, if appropriate in turn with a current-limiting resistor (not represented). The LED chips 8a, 8b are respectively connected by means of a wire bridge to the wire connecting pad 7a, 7b on the opposite side of the fusible link 4 and are consequently connected in parallel with the fusible link 4 and in antiparallel with each other.

The leadframe 4 is further surrounded by a preferably radiation-permeable enclosure 10. When putting together the enclosure and producing the component, it is advantageously possible here to rely on established techniques in LED production.

For forming the enclosure 10, the leadframe is preferably embedded in a radiation-permeable molding composition. A molding method, an injection molding method, a transfer molding method or a compression molding method may be used for example for embedding the leadframe.

Reaction resins, such as epoxy resins, acrylic resins, silicone resins or mixtures of these resins, are suitable for example as the molding composition. Furthermore, a flame retardant may be added to the molding composition, in order to reduce the risk of the molding composition igniting when the fusible link melts through. If appropriate, it is advantageous to dispense with the enclosure around the fusible link, so that, when the fusible link is heated, the amount of heat entering the enclosure is reduced and consequently the risk of fire is likewise reduced.

Furthermore, the molding composition may also contain fluorescent materials, which convert radiation generated by the LED of a first wavelength at least partly into radiation of a second wavelength. Consequently, the visual impression of mixed-colored light can be created. On account of the thus enlarged colored space, more detailed classification of the component is possible on the basis of the color of the light generated. Moreover, adaptation of the color to creative requirements and design specifications is possible within broad limits.

For this purpose, an inorganic fluorescent-material pigment powder with fluorescent materials with the general formula $A_3B_5X_{12}$:M can be used in particular as an additive for the molding composition. These materials are, for example, garnets doped with rare earths, in particular Ce.

Compounds which satisfy the formula A'$_3$B'$_5$O$_{12}$:M have proven to be successful as efficient fluorescent materials (provided that they are not unstable under the usual production and operating conditions). In this formula, A' denotes at least one element of the group Y, Lu, Sc, La, Gd, Tb and Sm, B' denotes at least one element of the group Al, Ga and In and M' denotes at least one element of the group Ce and Pr, preferably Ce. Particularly efficient fluorescent materials are in this case the compounds YAG:Ce (Y$_3$Al$_5$O$_{12}$:Ce), TAG:Ce (Tb$_3$Al$_5$O$_{12}$:Ce), TbYAG:Ce ((Tb$_x$Y$_{1-x}$)$_3$Al$_5$O$_{12}$:Ce, $0 \leq x \leq 1$), GdYAG:Ce ((Gd$_x$Y$_{1-x}$)$_3$Al$_5$O$_{12}$:Ce$^{3+}$, $0 \leq x \leq 1$) and GdTbYAG:Ce ((Gd$_x$Tb$_y$Y$_{1-x-y}$)$_3$Al$_5$O$_{12}$:Ce$^3$, $0 \leq x \leq 1$, $0 \leq y \leq 1$) and mixtures based on these. In this case, Al may be at least partly substituted by Ga or In. The fluorescent materials mentioned are to be understood as examples and not as restricting the general formula A$_3$B$_5$X$_{12}$:M.

Also suitable as the fluorescent material are the compounds SrS:Ce$^{3+}$, Na, SrS:Ce$^{3+}$, Cl, SrS:CeCl$_3$, CaS:Ce$^{3+}$ and SrSe:Ce$^{3+}$. In addition, sulfide- and oxysulfide-based host lattices and also aluminates, borates, alkaline earth sulfides, thiogallates, or orthosilicates, etc. with metal centers that can be correspondingly excited in the short-wave range or organometallic fluorescent material systems can also be used. Furthermore, soluble and scarcely soluble organic dyes and fluorescent material mixtures can be used.

In the case of the exemplary embodiment shown in FIG. 4, the enclosure 10 is also provided on the upper side with a roughening 11. This roughening disturbs the total reflection at this surface of the light generated by the LEDs, so that the coupling-out of light is increased and, as a consequence, the visibility of the optical indicator is improved.

A further possibility for increasing the coupling-out of light is to provide the surface of the enclosure at least partly with a structuring, such as for example a multiplicity of grooves, dimples, prisms, lenses or the like. The total reflection is likewise disturbed at the structured surface and the visibility of the indicator improved in this way.

The color of the radiated light can be used for characterizing the fuse component, for example for identifying the maximum current. For example, red-emitting LEDs may be used in the case of 10 A automobile fuses and yellow LEDs may be used in the case of 6 A automobile fuses. Consequently, in the event of a fuse defect, both the defect and the type of replacement fuse required are indicated to the user.

The description of the invention on the basis of the exemplary embodiments shown is of course not to be understood as restricting the invention to these embodiments. Rather, there are virtually no limits to the forming of the fuse component, so that it can be adapted unrestrictedly to the respective use.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A fuse component, comprising:
a first terminal,
a second terminal, and
a fusible link, which connects the first terminal to the second terminal in an electrically conducting manner,
wherein the fuse component includes at least one LED, which is connected on the cathode side to the first terminal and on the anode side to the second terminal, and
wherein one of the first and second terminals includes a contact;
wherein the contact is one of (i) mounted directly on the one of the first and second terminals or (ii) part of the one of the first and second terminals;
wherein the LED is included in the form of an LED chip that is mounted directly on the contact of the one of the first and second terminals; and
wherein the contact comprises at least one chip connecting pad, the contact and at least one wire connecting pad being formed on a leadframe including the first and second terminals, the LED chip being mounted on the chip connecting pad and connected in an electrically conducting manner to the wire connecting pad.

2. The fuse component as claimed in claim 1, wherein the contact comprises a current-limiting resistor.

3. The fuse component as claimed in claim 1, wherein the terminals and the fusible link are formed as parts of a leadframe and the LED is arranged on the leadframe.

4. The fuse component as claimed in claim 3, wherein the leadframe has the basic form of a yoke including yoke arms and a yoke bar, the yoke arms forming the terminals.

5. The fuse component as claimed in claim 4, wherein the fusible link is formed parallel to the yoke bar or as part of the yoke bar.

6. The fuse component as claimed in claim 1, wherein the fuse component includes two LEDs, the first LED being connected on the cathode side to the first terminal and on the anode side to the second terminal and the second LED being connected on the cathode side to the second terminal and on the anode side to the first terminal.

7. The fuse component as claimed in claim 1, wherein the fuse component is at least partly enclosed by a molding composition.

8. The fuse component as claimed in claim 7, wherein the fuse component is enclosed with the molding composition by means of a molding method, a spraying method, an injection molding method, a transfer molding method or a compression molding method.

9. The fuse component as claimed in claim 7, wherein the molding composition is permeable to radiation that is generated by the LED.

10. The fuse component as claimed in claim 7, wherein the molding composition contains a reaction resin, in particular an epoxy resin, an acrylic resin, a silicone resin or a mixture of these resins.

11. The fuse component as claimed in claim 7, wherein the molding composition contains a flame retardant.

12. The fuse component as claimed in claim 7, wherein the molding composition contains at least one fluorescent material which converts radiation emitted by the LED of a first wavelength at least partly into radiation of a second wavelength.

13. The fuse component as claimed in claim 7, wherein the surface of the molding composition is at least partly roughened or at least partly structured.

14. The fuse component as claimed in claim 7, wherein the color of the light generated by means of the LED visually indicates the fuse type.

15. The fuse component as claimed in claim 1, wherein the terminal on which the LED chip is arranged has a flat form and comprises two opposing main faces, and the LED chip is mounted on one of said two opposing main faces.

16. A fuse component with a first terminal, a second terminal and a fusible link, which connects the first terminal to the second terminal in an electrically conducting manner, wherein the fuse component includes at least one LED, which is connected on the cathode side to the first terminal and on the anode side to the second terminal, wherein the fuse component is at least partly enclosed by a molding composition including at least one fluorescent material which converts radiation emitted by the LED of a first wavelength at least partly into radiation of a second wavelength.

17. A fuse component, comprising:
   a first terminal,
   a second terminal, and
   a fusible link, which connects the first terminal to the second terminal in an electrically conducting manner,
   wherein the fuse component includes at least one LED, which is connected on the cathode side to the first terminal and on the anode side to the second terminal, and
   wherein one of the first and second terminals includes a contact;
   wherein the contact is one of (i) mounted directly on the one of the first and second terminals or (ii) part of the one of the first and second terminals;
   wherein the LED is included in the form of an LED chip that is mounted directly on the contact of the one of the first and second terminals; and
   wherein the fuse component is at least partly enclosed by a molding composition comprising at least one fluorescent material which converts radiation emitted by the LED of a first wavelength at least partly into radiation of a second wavelength.

* * * * *